(12) United States Patent
Yamauchi

(10) Patent No.: US 8,895,961 B2
(45) Date of Patent: Nov. 25, 2014

(54) POLYMER LIGHT EMITTING ELEMENT, METHOD FOR MANUFACTURING THE SAME AND POLYMER LIGHT EMITTING DISPLAY DEVICE

(75) Inventor: Shohgo Yamauchi, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 493 days.

(21) Appl. No.: 12/810,778

(22) PCT Filed: Dec. 25, 2008

(86) PCT No.: PCT/JP2008/073610
§ 371 (c)(1),
(2), (4) Date: Jun. 25, 2010

(87) PCT Pub. No.: WO2009/084590
PCT Pub. Date: Jul. 9, 2009

(65) Prior Publication Data
US 2010/0270544 A1   Oct. 28, 2010

(30) Foreign Application Priority Data

Dec. 28, 2007   (JP) ................................ 2007-341228

(51) Int. Cl.
| C09K 11/06 | (2006.01) |
| H01L 51/52 | (2006.01) |
| H05B 33/14 | (2006.01) |
| H01L 51/50 | (2006.01) |

(52) U.S. Cl.
CPC .... H01L 51/5234 (2013.01); *C09K 2211/1416* (2013.01); H01L 51/5092 (2013.01); H05B 33/14 (2013.01); C09K 11/06 (2013.01); *C09K 2211/1433* (2013.01)
USPC ............................. 257/40; 257/749; 257/750

(58) Field of Classification Search
USPC ................................ 257/40, E51.027, 88, 98
See application file for complete search history.

(56) References Cited

U.S. PATENT DOCUMENTS 6,284,393 B1   9/2001   Hosokawa et al.
6,445,126 B1   9/2002   Arai et al.

(Continued)

FOREIGN PATENT DOCUMENTS

| JP | 2000-068065 A | 3/2000 |
| JP | 2004-079422 A | 3/2004 |

(Continued)

OTHER PUBLICATIONS

Wenfa et al., "Low-voltage top-emitting organic light-emitting devices with an organic double-heterojunction structure", Semiconductor Science and Technology, Mar. 14, 2005, pp. 443-444, vol. 22, China.

(Continued)

*Primary Examiner* — Khiem D Nguyen
*Assistant Examiner* — Wilner Jean Baptiste
(74) *Attorney, Agent, or Firm* — Sughrue Mion, PLLC

(57) ABSTRACT

A polymer light emitting element having a large light releasing surface, a high light emitting efficiency and a long life, a polymer light emitting display device and planar light source, as well as a method for manufacturing the polymer light emitting element are provided. The polymer light emitting element is characterized by comprising a first electrode, a second electrode and a light emitting layer provided between the first electrode and the second electrode and containing a polymer compound, wherein the second electrode is composed of three layers, a first layer, a second layer and a third layer arranged in this order viewed from the light emitting layer, and at least one of materials contained in the second layer has a reducing action on at least one of materials contained in the first layer, and the visible light transmittance of the third layer is 40% or more.

15 Claims, 1 Drawing Sheet

(56) References Cited

U.S. PATENT DOCUMENTS

| | | | |
|---|---|---|---|
| 7,696,524 B2* | 4/2010 | Ikeda et al. | 257/98 |
| 7,919,920 B2* | 4/2011 | Kwak | 313/512 |
| 2001/0044035 A1* | 11/2001 | Morii | 428/690 |
| 2002/0113241 A1* | 8/2002 | Kubota et al. | 257/79 |
| 2003/0031438 A1* | 2/2003 | Kambe et al. | 385/122 |
| 2004/0012331 A1* | 1/2004 | Yamazaki et al. | 313/506 |
| 2004/0239239 A1 | 12/2004 | Fukase | |
| 2004/0241494 A1* | 12/2004 | Takasu et al. | 428/690 |
| 2005/0088082 A1 | 4/2005 | Morita et al. | |
| 2006/0194073 A1* | 8/2006 | Okada | 428/690 |
| 2006/0199035 A1* | 9/2006 | Choulis et al. | 428/690 |
| 2006/0236918 A1 | 10/2006 | Jun et al. | |
| 2006/0261328 A1* | 11/2006 | Nakaya et al. | 257/40 |
| 2007/0046192 A1* | 3/2007 | Akai et al. | 313/506 |
| 2007/0085075 A1* | 4/2007 | Yamazaki et al. | 257/40 |
| 2007/0222370 A1 | 9/2007 | Zhu et al. | |
| 2007/0228942 A1 | 10/2007 | Akai et al. | |
| 2007/0290604 A1 | 12/2007 | Sakanoue et al. | |
| 2008/0050604 A1* | 2/2008 | Takahashi et al. | 428/500 |
| 2008/0272691 A1 | 11/2008 | Chen et al. | |
| 2010/0051902 A1* | 3/2010 | Hiura et al. | 257/13 |

FOREIGN PATENT DOCUMENTS

| | | |
|---|---|---|
| JP | 2004-311403 | 11/2004 |
| JP | 2005-135624 A | 5/2005 |
| JP | 2005-135706 | 5/2005 |
| JP | 2005-140275 | 6/2005 |
| JP | 2006-186317 A | 7/2006 |
| JP | 2007-129170 A | 5/2007 |
| JP | 2007-265792 A | 10/2007 |
| JP | 2007-329054 A | 12/2007 |
| JP | 2007-536697 A | 12/2007 |
| JP | 2008-041692 A | 2/2008 |
| KR | 10-0610179 B1 | 8/2006 |
| TW | 200425787 A | 11/2004 |
| WO | 2006/049579 A1 | 5/2006 |

OTHER PUBLICATIONS

Hung et al., "Application of an ultrathin LiF/Al bilayer in organic surface-emitting diodes," Applied Physics Letters, Jan. 22, 2001, pp. 544-546, vol. 78, No. 4, China.

Hong et al. "Highly efficient red phosphorescent light-emitting diodes based on ruthenium(II)-complex-doped semiconductive polymers", Applied Physics Letters, Jan. 12, 2004, vol. 84, No. 2, pp. 290-292, China.

Japanese Office Action issued on Apr. 30, 2013 in Japanese Application No. 2008-330525.

Japanese Office Action issued on Oct. 8, 2013 in Japanese Application No. 2008-330525.

Han-Ki Kim et al., "Magnetic Field Shape Effect on Electrical Properties of TOLEDs in the Deposition of ITO Top Cathode Layer", Electrochemical and Solid-State Letters, 8 (12) H103-H105 (2005).

Deuk Yeon Lee et al., "Effect of Low Pressure Remote Plasma Treatment on Damage Reduction of Emitting Organic Layer for Top-Emission Organic Light-Emitting Diodes", Japanese Journal of Applied Physics, vol. 45, No. 13, 2006, pp. L376-L379.

Sung Mook Chung et al., "The triple layer anode for flexible top emission organic light-emitting devices", IMID '07 Digest, p. 698-701, 2007.

Xue-Wen Chen, "Comprehensive analysis and optimal design of top-emitting organic light-emitting devices", Journal of Applied Physics 101, 113107-1-113107-6 (2007).

Office Action mailed on Sep. 22, 2014 from the Korean Patent Office in counterpart Korean Application No. 10-2010-7014078.

Office Action dated Sep. 2, 2014 fromt the Taiwanese Patent Office in a counterpart Taiwanese Application No. 097150759.

* cited by examiner

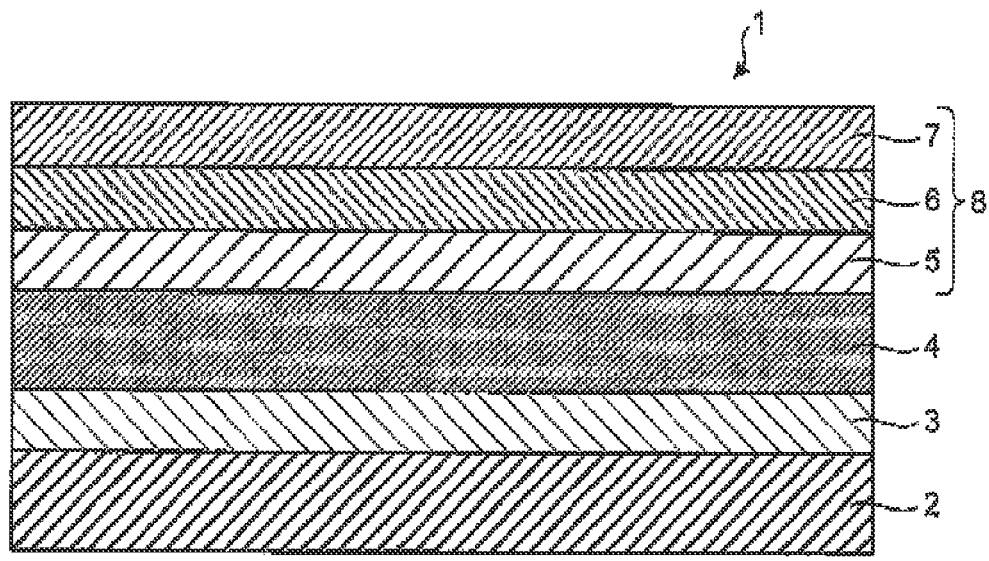

POLYMER LIGHT EMITTING ELEMENT, METHOD FOR MANUFACTURING THE SAME AND POLYMER LIGHT EMITTING DISPLAY DEVICE

CROSS REFERENCE TO RELATED APPLICATIONS

This application is a National Stage of International Application No. PCT/JP2008/073610 filed Dec. 25, 2008, claiming priority from Japanese Patent Application No. 2007-341228, filed Dec. 28, 2007, the contents of all of which are incorporated herein by reference in their entirety.

TECHNICAL FIELD

The present invention relates to a polymer light emitting element, a method for manufacturing the same and a polymer light emitting display device having such a polymer light emitting element.

BACKGROUND ART

In a case of an organic light emitting element with an active matrix driving scheme, when a so-called bottom emission type element in which the light is emitted from a substrate side is made, an aperture for emitting the light every element becomes smaller because a drive circuit is present. Thus, it has been proposed to make a so-called top emission type element in which the light is emitted from the side opposite to the substrate in order to assure a large light emitting surface. An organic light emitting element having a cathode composed of three layers has been known, in which a first layer and a third layer are oxide thin film layers and a second layer is composed of a thin film of a metal selected from Au, Ag, Cu, Pd and Pt (e.g., Patent Document 1).

However, this organic light emitting element has a problem that a light emitting efficiency is low.
Patent Document 1: JP 2004-79422 A

DISCLOSURE OF INVENTION

Problem to be Solved by the Invention

It is an object of the present invention to provide a polymer light emitting element having a large light emitting surface per element and having a high light emitting efficiency, a polymer light emitting display device and a planar light source as well as a method for manufacturing the polymer light emitting element.

Means for Solving Problem

As a result of an extensive study for solving the above problem, the inventor of the present application has found that the above problem can be solved by using a polymer compound for a light emitting layer, employing an electrode (first electrode) provided at a side close to a substrate and employing an electrode having specific three layers as a counter electrode (second electrode) provided at the opposite side across the light emitting layer, and then completed the present invention.

That is, the present invention provides following:

[1] A polymer light emitting element comprising: a first electrode, a second electrode, and a light emitting layer provided between the first electrode and the second electrode and containing a polymer compound, wherein the second electrode is composed of three layers, a first layer, a second layer and a third layer arranged in this order viewed from the light emitting layer, wherein at least one material contained in the second layer has a reducing action on at least one material contained in the first layer, and wherein the visible light transmittance of the third layer is 40% or more.

[2] The polymer light emitting element according to the above [1], wherein each of all material(s) contained in the second layer has a reducing action on all material(s) contained in the first layer.

[3] The polymer light emitting element according to the above [1] or [2], wherein the first layer contains a material selected from the group consisting of a metal, a metal oxide, a metal fluoride and mixtures thereof.

[4] The polymer light emitting element according to any one of the above [1] to [3], wherein the second layer contains a metal selected from the group consisting of calcium, aluminum, magnesium and mixtures thereof.

[5] A polymer light emitting element comprising: a first electrode, a second electrode, and a light emitting layer provided between the first electrode and the second electrode and containing a polymer compound, wherein the second electrode is composed of three layers, a first layer, a second layer and a third layer arranged in this order viewed from the light emitting layer, wherein the first layer contains a material selected from the group consisting of a metal, a metal oxide, a metal fluoride and mixtures thereof, wherein the second layer contains a metal selected from the group consisting of calcium, aluminum, magnesium and mixtures thereof, and wherein the visible light transmittance of the third layer is 40% or more.

[6] The polymer light emitting element according to the above [5], wherein the first layer contains a metal oxide and/or a metal fluoride, and wherein a material contained in the second layer is a reducing agent for the material contained in the first layer.

[7] The polymer light emitting element according to the above [5] or [6], wherein the first layer contains a metal and wherein the material contained in the second layer is a reducing agent for an oxide of the metal contained in the first layer.

[8] The polymer light emitting element according to any one of the above [1] to [7], wherein the first layer contains a material selected from the group consisting of an alkali metal, an alkaline earth metal, an oxide of an alkali metal, an oxide of an alkaline earth metal, a fluoride of an alkali metal, a fluoride of an alkaline earth metal and mixtures thereof.

[9] The polymer light emitting element according to the above [8], wherein the first layer contains a material selected from the group consisting of barium, barium oxide, barium fluoride and mixtures thereof.

[10] The polymer light emitting element according to the above [8], wherein the first layer contains a material selected from the group consisting of sodium, sodium oxide, sodium fluoride and mixtures thereof.

[11] The polymer light emitting element according to the above [8], wherein the first layer contains a material selected from the group consisting of rubidium, rubidium oxide, rubidium fluoride and mixtures thereof.

[12] The polymer light emitting element according to any one of the above [1] to [11], wherein the third layer is composed of a material selected from the group consisting of gold, silver, copper, tin, lead, nickel, indium and an alloy thereof and a film thickness thereof is 5 nm to 30 nm.

[13] The polymer light emitting element according to any one of the above [1] to [12], wherein the visible light reflectance of the first electrode is 80% or more.

[14] A method for manufacturing the polymer light emitting element according to any one of the above [1] to [13], the method comprising:

a step of providing a first electrode on a substrate, a step of providing a light emitting layer on the first electrode and a step of providing a second electrode on the light emitting layer, wherein the step of providing the second electrode includes:

a step of providing a first layer on the light emitting layer, a step of providing a second layer on the first layer and a step of providing a third layer on the second layer.

[15] The method according to the above [14], wherein the step of providing the first layer on the light emitting layer, the step of providing the second layer on the first layer and the step of providing the third layer on the second layer are carried out by a vacuum deposition method.

[16] A polymer light emitting display device comprising the polymer light emitting element according to any one of the above [1] to [13] as a pixel unit.

[17] A planar light source having the polymer light emitting element according to any one of the above [1] to [13].

BRIEF DESCRIPTION OF DRAWINGS

FIG. 1 shows a cross-sectional view of one embodiment of a polymer light emitting element according to the present invention.

EFFECT OF THE INVENTION

In the polymer light emitting element of the present invention and the polymer light emitting display device of the present invention comprising the same, the light radiating surface per element is large, the light emitting efficiency is high, and the top emission type element and display device can be made easily. Thus, the light radiating surface per element is large and good images can be obtained. A brightness half life is long in the polymer light emitting element of the present invention. Thus, the present invention can provide the display device having a long life. In the manufacturing method of the present invention, the polymer light emitting element of the present invention can be produced easily.

BEST MODE(S) FOR CARRYING OUT THE INVENTION

The polymer light emitting element 1 of the present invention has a first electrode 3, a second electrode 8, and a light emitting layer 4 provided between the first electrode and the second electrode and containing a polymer compound. The polymer light emitting element of the present invention further has a substrate (support substrate) 2 as a generally optional constituent, and the first electrode, the second electrode and the light emitting layer as well as if necessary other optional constituents may be provided on such a substrate. Further, a sealing film (or sealing substrate), which sandwiches the light emitting layer together with the support substrate and shields the light emitting layer from ambient air, may be provided as an optional constituent.

The polymer light emitting element of the present invention is generally constituted so that the light emitted from the light emitting layer is radiated from a second electrode side.

In the polymer light emitting element of the present invention, the first electrode, the light emitting layer and the second electrode may be generally stacked in this order directly or through the other optional constituent(s). One of the first electrode and the second electrode is an anode and the other is a cathode. The first electrode is often the anode, but the second electrode may be the anode without being limited thereto.

1. First Electrode

In the present invention, the first electrode is generally provided on the substrate directly or via the other layer(s) if necessary. The first electrode may be generally provided as a reflection electrode that reflects the light from the light emitting layer toward the second electrode side. It is preferable that the first electrode is provided together with a circuit for an active matrix driving scheme. The circuit for the active matrix driving scheme is not particularly limited, and the publicly known circuit may be employed.

It is preferable that the first electrode has the visible light reflectance of 80% or more. Thus having such a reflectance, the first electrode may be advantageously used as the reflection electrode in a top emission type display element.

The first electrode is preferably provided as the anode. In terms of hole supply performance to organic semiconductor materials used for a hole injection layer, a hole transport layer, an interlayer, the light emitting layer and the like, it is preferable that a work function of a light emitting layer side surface in the first electrode is 4.0 eV or more.

A metal usable for the first electrode may be an alloy, a metal oxide, a metal sulfide, an electrically conductive compound or mixtures thereof. Specifically, the metal may be a conductive metal oxide such as tin oxide, zinc oxide, indium oxide, indium tin oxide (ITO), indium zinc oxide (IZO) or molybdenum oxide; or a metal such as gold, silver, chromium and nickel; or further mixtures of the conductive metal oxide and the metal.

The first electrode may be a monolayer structure composed of one or two or more these materials, or a multilayer structure composed of multiple layers of the same composition or different compositions.

2. Light Emitting Layer

In the present invention, the light emitting layer is generally provided on the first electrode provided on the substrate, directly or via the other layer(s) if necessary. The light emitting layer used in the present invention is the light emitting layer containing a polymer compound. Materials that constitute the light emitting layer will be described later.

3. Second Electrode

In the present invention, the second electrode 8 is generally provided on the light emitting layer directly or via the other layer(s) if necessary, and is composed of three layers, i.e., a first layer 5, a second layer 6 and a third layer 7 arranged in this order viewed from a light emitting layer.

In one embodiment of the present invention, at least one of the materials contained in the second layer has a reducing action on at least one of the materials contained in the first layer in the second electrode. Preferably, each of all types of the materials contained in the second layer has a reducing action on all types of the materials contained in the first layer. In this embodiment, the first layer preferably contains a material selected from the group consisting of a metal, a metal oxide, a metal fluoride and mixtures thereof. The second layer preferably contains a metal selected from the group consisting of calcium, aluminum, magnesium and mixtures thereof.

In still another embodiment of the present invention, the first layer in the second electrode contains a material selected from the group consisting of a metal, a metal oxide, a metal fluoride and mixtures thereof, and the second layer contains a metal selected from the group consisting of calcium, aluminum, magnesium and mixtures thereof. In this embodiment, more specifically, the following three variation examples (a) to (c) may be included.

(a) The first layer contains a metal oxide and/or a metal fluoride and a material contained in the second layer is a reducing agent for the material contained in the first layer.
(b) The first layer contains a metal and a material contained in the second layer is a reducing agent for an oxide of the metal contained in the first layer.
(c) The first layer contains a metal, a metal oxide and a metal fluoride, and a material contained in the second layer is a reducing agent for the material contained in the first layer.

Among the above variation examples (a) to (c), (a) or (b) is more preferable.

In above each embodiment, when the first layer contains a material selected from the group consisting of a metal, a metal oxide, a metal fluoride and mixtures thereof, the first layer may be formed as a layer substantially composed of these materials. The metal is preferable among the metal, the metal oxide, the metal fluoride and mixtures thereof. Examples of metal that constitutes the metal, the metal oxide, the metal fluoride and mixtures thereof to be contained in the first layer may include an alkali metal and/or an alkaline earth metal. More specifically, the examples may include lithium, sodium, potassium, rubidium, cesium, beryllium, magnesium, calcium, strontium and barium, and it is preferable to be barium, sodium and rubidium. When the material that constitutes the second layer contains calcium or magnesium, it is preferable that the metal that constitutes the first layer is a metal other than this.

When the second layer contains a metal selected from the group consisting of calcium, aluminum, magnesium and mixtures thereof, the second layer may be formed as a layer composed substantially of only any of these metals, oxide of these metals, fluoride of these metals or mixtures thereof. In particular, it is preferable to be substantially composed of these metals only.

Being substantially composed of these metals only means that other elements contaminated in forming steps such as vapor deposition and processes such as oxidation may be included. A state of being substantially composed of these metals only may be represented by, for example, 90 mol % or more, 95 mol % or more or 98 mol % or more of a metal content ratio if specifically shown as numerical values.

The presence or absence and a degree of a reductive capacity between the materials can be determined from bond dissociation energy between compounds ($\Delta rH°$) when the material contained in the second layer is the reducing agent for the material contained in the first layer, when the material contained in the second layer is the reducing agent for an oxide of the metal contained in the first layer and when the material contained in the second layer has the reducing action on the material contained in the first layer. That is, in the case of the combination in which the bond dissociation energy is positive in a reducing reaction of the material contained in the first layer with the material contained in the second layer, it can be said that the material in the second layer has the reductive capacity for the material in the first layer.

The bond dissociation energy can be referred to, for example, Electrochemistry Fifth edition (Maruzen Co., Ltd., 2000) and Thermal Dynamics Database MALT (Science Technology Co., Ltd., 1992). To cite a case, in the combination of $BaF_2$ and Ca, it is indicated as follows.

$BaF_2 + Ca \rightarrow Ba + CaF_2$, $\Delta rH° = -9.0$

This reaction is an endothermic reaction. Thus, Ca does not have the reductive capacity for $BaF_2$. In the combination of $BaF_2$ and Mg, $BaF_2 + Mg \rightarrow Ba + MgF_2$, $\Delta rH° = 83.7$ This reaction is an exothermic reaction. Thus, Mg has the reductive capacity for $BaF_2$. A unit of $\Delta rH°$ in the formula is kJ/mol.

Examples of the material in the first layer and the material in the second layer in combination in which the material in the second layer has the reductive capacity for the material in the first layer will be listed below. In the following formulae, the material in a left side in a left part is the material in the first layer and the material in a right side in the left part is the material in the second layer. The material in the right side in the left part is the reducing agent for the material in the left side in the left part.

(1) $3BaO + 2Al \rightarrow 3Ba + Al_2O_3$, $\Delta rH° = 3.04$
(2) $BaO + Ca \rightarrow Ba + CaO$, $\Delta rH° = 81.5$
(3) $3BaF_2 + 2Al \rightarrow 3Ba + 2AlF_3$, $\Delta rH° = 613.1$
(4) $BaF_2 + Mg \rightarrow Ba + MgF_2$, $\Delta rH° = 83.7$
(5) $3LiF + Al \rightarrow 3Li + AlF_3$, $\Delta rH° = 343.8$
(6) $3LiF + 1.5Ca \rightarrow 3Li + 1.5CaF_2$, $\Delta rH° = 18.5$
(7) $2LiF + Mg \rightarrow 2Li + MgF_2$, $\Delta rH° = 108.5$
(8) $3NaF + Al \rightarrow 3Na + AlF_3$, $\Delta rH° = 216.8$
(9) $2NaF + Mg \rightarrow 2Na + MgF_2$, $\Delta rH° = 23.9$
(10) $3Na_2CO_3 + 2Al \rightarrow 6Na + Al_2O_3 + 3CO_2$, $\Delta rH° = 554.6$
(11) $Na_2CO_3 + Ca \rightarrow 2Na + CaO + CO_2$, $\Delta rH° = 102.1$
(12) $Na_2CO_3 + Mg \rightarrow 2Na + MgO + CO_2$, $\Delta rH° = 135.5$
(13) $3KF + Al \rightarrow 3K + AlF_3$, $\Delta rH° = 197.7$
(14) $2KF + Ca \rightarrow 2K + CaF_2$, $\Delta rH° = 93.4$
(15) $2KF + Mg \rightarrow 2K + MgF_2$, $\Delta rH° = 11.1$
(16) $3K_2CO + 2Al \rightarrow 6K + Al_2O_3 + 3CO_2$, $\Delta rH° = 615.6$
(17) $K_2CO + Ca \rightarrow 2K + CaO + CO_2$, $\Delta rH° = 122.4$
(18) $K_2CO + Mg \rightarrow 2K + MgO + CO_2$, $\Delta rH° = 155.8$
(19) $3RbF + Al \rightarrow 3Rb + AlF_3$, $\Delta rH° = 169.0$
(20) $2RbF + Ca \rightarrow 2Rb + CaF_2$, $\Delta rH° = 57.6$
(21) $2RbF + Mg \rightarrow 2Rb + MgF_2$, $\Delta rH° = 153.8$
(22) $3Rb_2CO + 2Al \rightarrow 6Rb + Al_2CO + 3CO_2$, $\Delta rH° = 570.6$
(23) $3CsF + Al \rightarrow 3Cs + AlF_3$, $\Delta rH° = 156.4$
(24) $2CsF + Ca \rightarrow 2Cs + CaF_2$, $\Delta rH° = 40.4$
(25) $2CsF + Mg \rightarrow 2Cs + MgF_2$, $\Delta rH° = 136.6$
(26) $CsF + Ag \rightarrow Cs + AgF$, $\Delta rH° = 348.9$
(27) $3Cs_2CO + 2Al \rightarrow 6Cs + Al_2O_3 + 3CO_2$, $\Delta rH° = 581.7$
(28) $Cs_2CO + Ca \rightarrow 2Cs + CaO + CO_2$, $\Delta rH° = 111.1$
(29) $Cs_2CO + Mg \rightarrow 2Cs + MgO + CO_2$, $\Delta rH° = 144.5$ As one embodiment of the element of the present invention, the first layer may be designed in some cases so that a metal contained in the first layer is not oxide or fluoride, but the metal is a substance that can be oxidized or fluorinated, and the first layer is substantially composed of such metal only. Even if the first layer is substantially composed of such metal only, the metal not being oxide or fluoride on the design, oxide or fluoride of the material composed of the first layer may be produced due to a trace amount of oxygen and moisture in its manufacturing process or a driving process of the element. When the material in the second layer has the reducing action on that oxide or the fluoride, it is possible to obtain the effect of the present invention. Therefore, even in a case that the material in the first layer is substantially composed of the metal only and the metal is not oxide or fluoride, but if the material in the second layer has the reducing action on any one or more of oxide or fluoride of that metal, this case corresponds to the case in which "the material in the second layer has the reducing action on the material in the first layer" referred in the present invention.

In this case, calcium, aluminum and magnesium as listed above may be suitably used as the material in the second layer.

In the present invention, the third layer that constitutes the second electrode has its visible light transmittance of 40% or more and preferably 50% or more. Thus having such a visible light transmittance, it is possible to make the second electrode a translucent electrode.

It is preferable that a material that constitutes the third layer is selected from the group consisting of gold, silver, copper, tin, lead, nickel, indium and an alloy thereof.

A thickness of the first layer to the third layer that constitutes the second electrode is not particularly limited, but the thickness is preferably 0.5 to 10 nm for the first layer, 0.5 to 10 nm for the second layer and 5 to 30 nm for the third layer. The visible light transmittance of the light that passes through the all layers in the second electrode is preferably 40% or more for using the second electrode as the electrode used for the light emitting surface.

A deposition method such as a vacuum deposition method is preferable as the method of forming the first layer to the third layer because it is possible to avoid damage to the light emitting layer. When the second electrode is formed by the vacuum deposition method, it is preferable that the substrate is placed in a chamber in a vacuum deposition apparatus, the pressure is reduced and the first layer to the third layer are continuously formed with keeping the vacuum because an operation is easy and simple and quality loss due to contamination of extraneous matters can be prevented.

An antireflection layer may be provided on the third layer in the second electrode for the purpose of enhancing the light transmittance of the second electrode. Those having a refractive index n of about 1.8 to 3.0 are preferable as the material used for the antireflection layer, and examples thereof may include ZnS, ZnSe and $WO_3$. A film thickness of the antireflection layer varies depending on the combination of the materials, but is generally in the range of 10 nm to 150 nm. For example, when the second electrode is utilized as composition of 5 nm of Ba for the first layer, 1 nm of Al for the second layer and 15 nm of Ag for the third layer, if 21 nm of $WO_3$ as the antireflection layer is stacked adjacent to the third layer, the light transmittance from the light emitting layer side is enhanced by 10%.

4. Other Constituents

The polymer light emitting element of the present invention has the first electrode and the second electrode, one of which is the anode and the other of which is the cathode as described above, and has at least the light emitting layer therebetween, and may further comprise optional constituents in addition thereto.

For example, a hole injection layer may be optionally provided between the anode and the organic light emitting layer. Further, one or more layers of an interlayer and a hole transport layer may be optionally provided between the organic light emitting layer, and the hole injection layer (when the hole injection is present) or the anode (when the hole injection layer is absence).

Meanwhile, an electron injection layer may be optionally provided between the cathode and the organic light emitting layer. Further, one or more layers of an electron transport layer and a hole block layer may be provided between the organic light emitting layer, and the electron injection layer (when the electron injection is present) or the cathode (when the electron injection layer is absence).

Here, the anode supplies holes to the hole injection layer, the hole transport layer, the interlayer and the light emitting layer. The cathode supplies electrons to the electron injection layer, the electron transport layer, the hole block layer and the light emitting layer.

The light emitting layer refers to the layer having a function that allows to inject the holes from the layer adjacent to an anode side and to inject the electrons from the layer adjacent to a cathode side, a function of moving the injected charges (electrons and holes) by electric field power and a function of providing a field for recombining the electron and the hole, resulting in light emission when an electric field is applied.

The electron injection layer and the electron transport layer refer to the layer having any of the function of injecting the electrons from the cathode, the function of transporting the electrons and the function of blocking the holes injected from the anode. The hole block layer refers to the layer having mainly the function of blocking the holes injected from the anode and if necessary having any of the function of injecting the electrons from the cathode and the function of transporting the electrons.

The hole injection layer and the hole transport layer refer to the layer having any of the function of injecting the holes from the anode, the function of transporting the holes, the function of supplying the holes to the light emitting layer and the function of blocking the electrons injected from the cathode. The interlayer has at least one or more of the function of injecting the holes from the cathode, the function of transporting the holes, the function of supplying the holes to the light emitting layer and the function of blocking the electrons injected from the cathode; is generally arranged adjacent to the light emitting layer; and has a role of isolating the light emitting layer from the anode or isolating the light emitting layer from the hole injection layer or the hole transport layer.

The electron transport layer and the hole transport layer are generically referred to as a charge transport layer. Also, the electron injection layer and the hole injection layer are generically referred to as a charge injection layer.

That is, the polymer light emitting element of the present invention may have the following layered structure (a), or may have a layered structure obtained by omitting one or more of the hole injection layer, the hole transport layer, the interlayer, the hole block layer, the electron transport layer and the electron injection layer in the layered structure (a).

(a) Anode-Hole injection layer-[Hole transport layer and/or Interlayer]-Light emitting layer-[Hole block layer and/or Electron transport layer]-Electron injection layer-Cathode Here a symbol "- (dash)" indicates that the respective layers are stacked adjacently.

"Hole transport layer and/or Interlayer" indicates the layer composed of the hole transport layer only, the layer composed of the interlayer only, the layered structure of Hole transport layer-Interlayer, the layered structure of Interlayer-Hole transport layer or the other optional layered structure including one or more hole transport layers and one or more interlayers.

"Hole block layer and/or Electron transport layer" indicates the layer composed of the hole block layer only, the layer composed of the electron transport layer only, the layered structure of Hole block layer-Electron transport layer, the layered structure of Electron transport layer-Hole block layer or the other optional layered structure including one or more hole block layers and one or more electron transport layers. The same meaning shall apply in the description in the following layered structures.

Further, the polymer light emitting element of the present invention may have two layers of the light emitting layers in one stacked structure. In this case, the polymer light emitting element may have the following layered structure (b), or may have a layered structure obtained by omitting one or more of the hole injection layer, the hole transport layer, the interlayer, the hole block layer, the electron transport layer, the electron injection layer and the electrode in the layered structure (b).

(b) Anode-Hole injection [layer-Hole transport layer and/or Interlayer]-Light emitting layer-[Hole block layer and/or Electron transport layer]-Electron injection layer-Electrode-Hole injection layer-[Hole transport layer and/or Interlayer]-Light emitting layer-[Hole block layer and/or Electron transport layer]-Electron injection layer-Cathode Further, the polymer light emitting element of the present invention may have three or more layers of the light emitting layers in one stacked structure. In this case, the polymer light emitting element may have the following layered structure (c), or may have a layered structure obtained by omitting one or more of the hole injection layer, the hole transport layer, the interlayer, the hole block layer, the electron transport layer, the electron injection layer and the electrode in the layered structure (c).

(c) Anode-Hole injection layer-[Hole transport layer and/or Interlayer]-Light emitting layer-[Hole block layer and/or Electron transport layer]-Electron injection layer-Repeating unit A-Repeating unit A- . . . -Cathode Here, "Repeating unit A" indicates the unit of the layered structure of Electrode-Hole injection layer-[Hole transport layer and/or Interlayer]-Light emitting layer-[Hole block layer and/or Electron transport layer]-Electron injection layer.

Preferable specific examples of the layered structure of the polymer light emitting element of the present invention may include the followings.

(d) Anode-Light emitting layer-Cathode
(e) Anode-Hole transport layer-Light emitting layer-Cathode
(f) Anode-Light emitting layer-Electron transport layer-Cathode
(g) Anode-Hole transport layer-Light emitting layer-Electron transport layer-Cathode For each of these layered structures, the layered structures in which the interlayer is provided adjacent to the light emitting layer between the light emitting layer and the anode are exemplified. Namely, the following layered structures (d') to (g') are shown as examples.

(d') Anode-Interlayer-Light emitting layer-Cathode
(e') Anode-Hole transport layer-Interlayer-Light emitting layer-Cathode
(f') Anode-Interlayer-Light emitting layer-Electron transport layer-Cathode
(g') Anode-Hole transport layer-Interlayer-Light emitting layer-Electron transport layer-Cathode In the present invention, the polymer light emitting element in which the charge injection layer (electron injection layer, hole injection layer) has been provided may include the polymer light emitting element in which the charge injection layer has been provided adjacent to the cathode and the polymer light emitting element in which the charge injection layer has been provided adjacent to the anode. Specific examples thereof may include the following layered structures (h) to (s).

(h) Anode-Hole injection layer-Light emitting layer-Cathode
(i) Anode-Light emitting layer-Electron injection layer-Cathode
(j) Anode-Hole injection layer-Light emitting layer-Electron injection layer-Cathode
(k) Anode-Hole injection layer-Hole transport layer-Light emitting layer-Cathode
(l) Anode-Hole transport layer-Light emitting layer-Electron injection layer-Cathode
(m) Anode-Hole injection layer-Hole transport layer-Light emitting layer-Electron injection layer-Cathode
(n) Anode-Hole injection layer-Light emitting layer-Electron transport layer-Cathode
(o) Anode-Light emitting layer-Electron transport layer-Electron injection layer-Cathode
(p) Anode-Hole injection layer-Light emitting layer-Electron transport layer-Electron injection layer-Cathode
(q) Anode-Hole injection layer-Hole transport layer-Light emitting layer-Electron transport layer-Cathode
(r) Anode-Hole transport layer-Light emitting layer-Electron transport layer-Electron injection layer-Cathode
(s) Anode-Hole injection layer-Hole transport layer-Light emitting layer-Electron transport layer-Electron injection layer-Cathode Similarly to (d') to (g'), the layered structures in which the interlayer is provided adjacent to the light emitting layer between the light emitting layer and the anode in each of these layered structures (h) to (s) are also shown as examples. In this case, the interlayer may double with the hole injection layer and/or the hole transport layer.

Further, in the polymer light emitting element of the present invention, an insulating layer having a film thickness of 2 nm or less may be provided adjacent to the electrode in order to enhance an adhesiveness to the electrode and improve the charge (i.e., hole or electron) injection from the electrode. Also, a thin buffer layer may be inserted in an interface of the charge transport layer (i.e., hole transport layer or electron transport layer) or the light emitting layer in order to enhance the adhesiveness of the interface and prevent a blend.

An order and the number of the layers to be stacked and the thickness of each layer can be appropriately determined by taking the light emitting efficiency and the brightness half life into consideration.

5. Materials that Compose Each Layer

Subsequently, materials of and methods for forming each layer that composes the polymer light emitting element of the present invention will be described more specifically.

<Substrate>

The substrate that constitutes the polymer light emitting element of the present invention is not particularly limited as long as the material is not changed when the electrode is formed and the layer of an organic matter is formed, and usable examples may include glass, plastic, a polymer film, a metal film, a silicon substrate or a stacked layers thereof is used. Such a substrate is commercially available or can be made by a publicly known method.

When the polymer light emitting element of the present invention composes a pixel in the display device, a circuit for driving the pixel may be provided on the substrate, or a flattened film may be provided on the drive circuit. When the flattened film is provided, it is preferable that a centerline mean roughness (Ra) of the flattened film meets Ra<10 nm.

<First Electrode>

In the present invention, the first electrode is generally provided as the reflection electrode as described above. The first electrode is preferably provided as the anode. The materials used for such a first electrode are as described above. The method for forming the first electrode may include the vacuum deposition method, a sputtering method, an ion plating method and a plating method.

The film thickness of the first electrode is generally 10 nm to 10 μm, preferably 20 nm to 1 μm and more preferably 50 nm to 500 nm.

When the first electrode is provided as the reflection electrode and the anode, it is preferable to make a multilayer structure obtained by combining a light reflection layer composed of a highly light reflexible material with a high work function material layer composed of the material having the work function of 4.0 eV or more.

Specific constitution examples of such a first electrode may include:
Al,
Ag,
Ag—MoO$_3$,
an alloy of Ag, Pd and Cu—ITO,
an alloy of Al and Nd—ITO
an alloy of Mo and Cr—ITO,
Cr—Al—Cr—ITO,
Cr—Ag—Cr—ITO,
Cr—Ag—Cr—ITO—MoO$_3$,
an alloy of Ag, Pd and Cu—IZO,
an alloy of Al and Nd—IZO,
an alloy of Mo and Cr—IZO,
Cr—Al—Cr—IZO,
Cr—Ag—Cr—IZO, and
Cr—Ag—Cr—IZO—MoO$_3$.

The film thickness of the highly light reflexible metal layer of Al, Ag, Al alloy and Ag alloy is preferably 50 nm or more and more preferably 80 nm or more in order to obtain a sufficient light reflectance. The film thickness of the high work function material layer of ITO and IZO is generally in the range of 5 nm to 500 nm.

In terms of preventing electric connection failure such as short-circuit, the centerline mean roughness (Ra) of a light emitting layer side surface of the first electrode meets desirably Ra<5 nm, and more preferably Ra<2 nm.

Ra can be measured based on Japanese Industrial Standards JIS-B0601-2001 with reference to JIS-B0651 to JIS-B0656 and JIS-B0671-1.

<Hole Injection Layer>

The hole injection layer may be provided between the anode and the hole transport layer, between the anode and the interlayer, or between the anode and the light emitting layer.

Materials for forming the hole injection layer in the polymer light emitting element of the present invention may include carbazole or derivative thereof, triazole or derivative thereof, oxazole or derivatives thereof, oxadiazole or derivatives thereof, imidazole or derivatives thereof, polyarylalkane or derivatives thereof, pyrazoline or derivatives thereof, pyrazolone or derivatives thereof, phenylenediamine or derivatives thereof, arylamine or derivatives thereof, starburst type amine, phthalocyanine or derivatives thereof, amino substituted chalcone or derivatives thereof, styrylanthracene or derivatives thereof, fluorenone or derivatives thereof, hydrazon or derivatives thereof, stilbene or derivatives thereof, silazane or derivatives thereof, aromatic tertiary amine compounds, styrylamine compounds, aromatic dimethylidyne compounds, porphyrin compounds, polysilane compounds, poly(N-vinyl carbazole) or derivatives thereof, organic silane derivatives, and polymers including these; oxides such as vanadium oxide, tantalum oxide, tungsten oxide, molybdenum oxide, ruthenium oxide and aluminum oxide; and amorphous carbon. Also conductive high molecular oligomers such as polyaniline, aniline copolymers, thiophene oligomers and polythiophene, and organic conductive materials such as poly(3,4-ethylenedioxythiophene)/polystyrene sulfonic acid and polypyrrole, and polymers including these may be included. Further, acceptor organic compounds such as tetracyanoquinodimethane or derivatives thereof (e.g., 2,3,5,6-tetrafluoro-7,7,8,8-tetracyanoquinodimethane), 1,4-naphthoquinone or derivatives thereof, diphenoquinone or derivatives thereof and polynitro compounds may be used suitably.

The foregoing material may be composed of a single component or may be a composition composed of multiple components. The hole injection layer may be a monolayer structure composed of one or two or more of the above materials, or a multilayer structure composed of multiple layers of one composition or different compositions. The materials listed as the material that may be used for the hole transport layer or the interlayer may also be used for the hole injection layer.

The film thickness of the hole injection layer is generally in the range of 1 nm to 150 nm, preferably 20 nm or more in terms of flatness of the film and preferably 80 nm or less in terms of driving voltage of the element.

<Hole Transport Layer and Interlayer>

Examples of a material that constitutes the hole transport layer and the interlayer may include carbazole or derivative thereof, triazole or derivatives thereof, oxazole or derivatives thereof, oxadiazole or derivatives thereof, imidazole or derivatives thereof, polyarylalkane or derivatives thereof, pyrazoline or derivatives thereof, pyrazolone or derivatives thereof, phenylenediamine or derivatives thereof, arylamine or derivatives thereof, amino substituted chalcone or derivatives thereof, styrylanthracene or derivatives thereof, fluorenone or derivatives thereof, hydrazon or derivatives thereof, stilbene or derivatives thereof, silazane or derivatives thereof, aromatic tertiary amine compounds, styrylamine compounds, aromatic dimethylidyne compounds, porphyrin compounds, polysilane compounds, poly(N-vinyl carbazole) derivatives, organic silane derivatives, and polymers including these structures. Also, the examples may include conductive high molecular oligomers such as aniline copolymers, thiophene oligomers and polythiophene, and organic conductive materials such as polypyrrole. The foregoing material may be composed of the single component or may be the composition composed of multiple components. The hole transport layer may be the monolayer structure composed of one or two or more of the above materials, or the multilayer structure composed of multiple layers of one composition or different compositions.

Specifically, the compounds disclosed in JP Sho-63-70257 A, JP Sho-63-175860 A, JP Hei-2-135359 A, JP Hei-2-135361 A, JP Hei-2-209988 A, JP Hei-3-37992 A, JP Hei-3-152184 A, JP Hei-5-263073 A, JP Hei-6-1972 A, International Publication WO2005/52027 Pamphlet and JP 2006-295203A may be used as the material for the hole transport layer. Among them, the polymer containing a repeating unit containing the structure of the aromatic tertiary amine compound is used suitably.

The repeating unit containing the structure of the aromatic tertiary amine compound may include the repeating unit represented by the following general formula (1).

[Chem. 1]

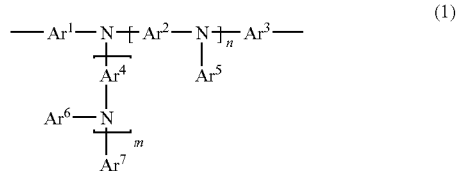

(1)

In the formula (1), each of $Ar^1$, $Ar^2$, $Ar^3$ and $Ar^4$ independently represents an arylene group that may have a substituent or a bivalent heterocyclic group that may have a substituent; $Ar^5$, $Ar^6$ and $Ar^7$ represent an arylene group that may have a substituent or a monovalent heterocyclic group that may have a substituent; n and m each independently represent 0 or 1 and $0 \leq n+m \leq 2$.

Hydrogen atoms on an aromatic ring in the formula (1) may be substituted with a substituent selected from a halogen atom, an alkyl group, an alkyloxy group, an alkylthio group, an aryl group, an aryloxy group, an arylthio group, an arylalkyl group, an arylalkyloxy group, an arylalkylthio group, an alkenyl group, an alkynyl group, an arylalkenyl group, an arylalkynyl group, an acyl group, an acyloxy group, an amide group, an acid imide group, an imine residue, a substituted amino group, a substituted silyl group, a substituted silyloxy group, a substituted silylthio group, a substituted silylamino group, a cyano, nitro group, a monovalent heterocyclic group, a heteroaryloxy group, a heteroarylthio group, an alkyloxycarbonyl group, an aryloxycarbonyl group, an arylalkyloxycarbonyl group, a heteroaryloxycarbonyl group and a carboxyl group.

The substituent may also be a crosslinking group such as a vinyl group, a ethenyl group, a butenyl group, an acryloyl group, an acrylate group, an acrylamide group, a methacryloyl group, a methacrylate group, a methacrylamide group, a vinylether group, a vinylamino group, a silanol group, a group having a small membered ring (e.g., a cyclopropyl group, a cyclobutyl group, an epoxy group, an oxetanyl group, a diketene group and an episulfide group), a group having a lactone structure, a group having a lactam, or a group containing the structure of siloxane or derivatives thereof. Also in addition to the above groups, the combination of groups capable of forming an ester bond and an amide bond (e.g., an ester group and an amino group; an ester group and a hydroxyl group) may also be used as the crosslinking groups.

Further, in the formula (1), $Ar^2$ and $Ar^3$ may be bound each other directly or through a bivalent group such as —O— or —S—.

The arylene group may include phenylene, the bivalent heterocyclic group may include pyridine-di-yl, and these groups may have the substituent(s).

The aryl group may include phenyl and naphthyl, the monovalent heterocyclic group may include pyridyl, and these groups may have the substituent(s).

The polymer containing the repeating unit containing the structure of the aromatic tertiary amine compound may further have the other repeating unit. The other repeating unit may include an arylene group such as phenylene and fluorene-di-yl.

Among these polymers, the polymer containing the crosslinking group is more preferable.

The method of forming a film of the hole transport layer and the interlayer is not particularly limited, and the method of forming the film from a mixed solution with a polymer binder is shown as an example for a low molecular hole transport material. The method of forming the film from a solution is shown as an example for a high molecular hole transport material.

A solvent used for forming the film from the solution is not particularly limited as long as the hole transport material is dissolved therein. Examples of the solvent may include chlorine solvents such as chloroform, methylene chloride and dichloroethane, ether solvents such as tetrahydrofuran, aromatic hydrocarbon solvents such as toluene and xylene, ketone solvents such as acetone and methyl ethyl ketone, and ester solvents such as ethyl acetate, butyl acetate and ethyl cellsolve acetate.

As the method of forming the film from the solution, applying methods such as coating methods e.g., a spin coating method, a casting method, a microgravure coating method, a gravure coating method, a bar coating method, a roll coating method, a wire bar coating method, a dip coating method, a slit coating method, a capillary coating method, a spray coating method and a nozzle coating method, and printing methods e.g., a gravure printing method, a screen printing method, a flexographic printing method, an offset printing method, a reverse printing method and an inkjet printing method from the solution may be employed. In terms of easy pattern formation, the printing methods, e.g., the gravure printing method, the screen printing method, the flexographic printing method, the offset printing method, the reverse printing method and the inkjet printing method are preferable.

As the polymer binder to be mixed, those that do not inhibit the charge transport excessively are preferable and those having a mild absorption of the visible light are also suitably used. Examples of the polymer binder may include polycarbonate, polyacrylate, polymethyl acrylate, polymethyl methacrylate, polystyrene, polyvinyl chloride and polysiloxane.

When the hole transport material is a low molecular compound such as pyrazoline or the derivative thereof, arylamine or the derivative thereof, stilbene or the derivative thereof or triphenyldiamine or the derivative thereof, the hole transport layer may be formed using the vacuum deposition method. The hole transport layer may be formed by the applying method using the mixed solution in which the low molecular hole transport material has been dispersed in a high molecular compound that does not inhibit the charge transport excessively and has the mild absorption of the visible light, such as poly(N-vinyl carbazole), polyaniline or the derivative thereof, polythiophene or the derivative thereof, poly(p-phenylene vinylene) or the derivative thereof, poly(2,5-thienylene vinylene) or the derivative thereof, polycarbonate, polyacrylate, polymethyl acrylate, polymethyl methacrylate, polystyrene, polyvinyl chloride or polysiloxane.

When the light emitting layer is formed subsequently to the formation of the hole transport layer and the interlayer, in particular when both the layers are formed by the applying method, the layer formed in advance is dissolved in the solvent contained in a coating solution used upon forming the layer later, resulting in not making the stacked structure in some cases. In this case, the method of making a lower layer insoluble in the solvent may be used. The method of making insoluble in the solvent may include: a method of crosslinking by synthetically attaching the crosslinking group to the high molecular compound itself; a method of crosslinking by mixing a low molecular compound possessing the crosslinking group having an aromatic ring typified by aromatic bisazide as the crosslinking agent; a method of crosslinking by mixing a low molecular compound possessing the crosslinking group having no aromatic ring typified by an acrylate group as a crosslinking agent; and a method of heating the lower layer to insolubilize in the organic solvent used for making an upper layer. When the lower layer is heated, a temperature for heating is generally about 150 to 300° C. and a time period is generally about one minute to one hour.

As the other method of stacking without dissolving the lower layer other than the crosslinking, the method of using the solution having different polarity for the solutions to be used for forming the adjacent layers is available. An example of the method is that the high molecular compound that is not dissolved in a polar solvent is used for the lower layer, and a coating solution containing the high molecular compound and the polar solvent is applied for forming the upper layer so that the lower layer is not dissolved.

The film thickness of the hole transport layer and the interlayer has a varying optimal value depending on the material to be used, and may be selected so that a driving voltage and the light emitting efficiency have an appropriate value. The film thickness of the hole transport layer and the interlayer needs the thickness at least not to cause a pinhole. When the film thickness is too thick, it is likely that the driving voltage of the element becomes high. Therefore, the film thickness of the hole transport layer and the interlayer is, for example, 1 nm to 1 μm, preferably 2 nm to 500 nm and more preferably 5 nm to 200 nm.

<Light Emitting Layer>

In the present invention, The light emitting layer contains a polymer compound. Specifically, the light emitting layer contains the following polymer material as a light emitting material.

As the polymer material, conjugated high molecular compounds such as polyfluorene or derivatives thereof (PF), polyparaphenylene vinylene or derivatives thereof (PPV), polyphenylene or derivatives thereof (PP), polyparaphenylene or derivatives thereof (PPP), polythiophene or derivatives thereof, polydialkylfluorene (PDAF), polyfluorenebenzothiadiazole (PFBT) and polyalkylthiophene (PAT) may be used suitably.

In addition to the above conjugated high molecular compounds, the light emitting layer composed of the foregoing polymer light emitting material may contain a high molecular dyestuff compound such as perylene dyestuffs, coumarin dyestuffs and rhodamine dyestuffs, and a low molecular dyestuff compound such as rubrene, perylene, 9,10-diphenylanthracene, tetraphenylbutadiene, Nile red, coumarin 6 and quinacridone. The light emitting layer may also contain naphthalene or derivatives thereof, anthracene or derivatives thereof, perylene or derivatives thereof, a dyestuff such as polymethine, xantene, coumarin and cyanine, a metal complexe of 8-hydroxyquinoline or derivatives thereof, or aromatic amine, tetraphenylcyclopentadiene or derivatives thereof, or a metal complex of Ir and the like that emit phosphorescence.

The light emitting layer that the light emitting element of the present invention may be composed of a mixed composition of a non conjugated high molecular compound [e.g., polyvinylcarbazole, polyvinyl chloride, polycarbonate, polystyrene, polymethyl methacrylate, polybutyl methacrylate, polyester, polysulfone, polyphenylene oxide, polybutadiene, poly(N-vinyl carbazole), hydrocarbon resin, ketone resin, phenoxy resin, polyamide, ethylcellulose, vinyl acetate, ABS resin, polyurethane, melamine resin, unsaturated polyester resin, alkyd resin, epoxy resin, silicon resin, a polymer containing carbazole or derivatives thereof, triazole or derivatives thereof, oxazole or derivatives thereof, oxadiazole or derivatives thereof, imidazole or derivatives thereof, polyarylalkane or derivatives thereof, pyrazoline or derivatives thereof, pyrazolone or derivatives thereof, phenylenediamine or derivatives thereof, arylamine or derivatives thereof, amino substituted chalcone or derivatives thereof, styrylanthracene or derivatives thereof, fluorenone or derivatives thereof, hydrazon or derivatives thereof, stilbene or derivatives thereof, silazane or derivatives thereof, aromatic tertiary amine compounds, styrylamine compounds, aromatic dimethylidyne compounds, porphyrin compounds, polysilane compounds, poly(N-vinyl carbazole) or derivatives thereof and organic silane derivatives] and a luminescent organic compound such as the organic dyestuffs and the metal complexes.

As such compounds, examples of a high molecular luminescent material may include Polyfluorene, derivatives thereof and copolymers thereof, polyarylene, derivatives thereof and copolymers thereof, polyarylenevinylene, derivatives thereof and copolymers thereof, and (co)polymers of aromatic amine and derivatives thereof disclosed in publications specified by numbers of WO99/13692, WO99/48160, GB2340304A, WO00/53656, WO01/19834, WO00/55927, GB2348316, WO00/46321, WO00/06665, WO99/54943, WO99/54385, U.S. Pat. No. 5,777,070, WO98/06773, WO97/05184, WO00/35987, WO00/53655, WO01/34722, WO99/24526, WO00/22027, WO00/22026, WO98/27136, WO98/21262, U.S. Pat. No. 5,741,921, WO97/09394, WO96/29356, WO96/10617, EP0707020, WO95/07955, JP 2001-181618 A, JP 2001-123156 A, JP 2001-3045 A, JP 2000-351967 A, JP 2000-303066 A, JP 2000-299189 A, JP 2000-252065 A, JP 2000-136379 A, JP 2000-104057 A, JP 2000-80167 A, JP Hei-10-324870 A, JP Hei-10-114891 A, JP Hei-9-111233 A and JP Hei-9-45478 A.

The compounds described in JP Sho-57-51781A and JP Sho-59-194393A are shown as examples of fluorescent materials of the low molecular compounds.

<Method of Forming Film of Light Emitting Layer>

The method of forming the film of the light emitting layer containing the high molecular light emitting material may include the same method as the method of forming the film of the hole transport layer. The method of applying the solution containing the light emitting material on or above the substrate, the vacuum deposition method or a transfer method may be used. Specific examples of the solvent used for forming the film from the solution may include the same solvents as those in which the hole transport material is dissolved when the film of the hole transport layer is formed from the solution. As the method of applying the solution containing the light emitting material on or above the substrate, the applying methods such as the coating methods e.g., the spin coating method, the casting method, the microgravure coating method, the gravure coating method, the bar coating method, the roll coating method, the wire bar coating method, the dip coating method, the slit coating method, the capillary coating method, the spray coating method and the nozzle coating method, and the printing methods e.g., the gravure printing method, the screen printing method, the flexographic printing method, the offset printing method, the reverse printing method and the inkjet printing method may be used. The printing methods, e.g., the gravure printing method, the screen printing method, the flexographic printing method, the offset printing method, the reverse printing method and the inkjet printing method are preferable in terms of easy pattern formation and easy color coding. When the light emitting material is a sublimatic low molecular compound, the vacuum deposition method may be used. In addition, the light emitting layer may be formed only on a desired place by laser transfer or thermal transfer.

The film thickness of the light emitting layer has the varying optimal value depending on the material to be used, and may be selected so that the driving voltage and the light emitting efficiency have the appropriate value. The film thickness of the light emitting layer needs the film thickness at least not to cause the pinhole. When the film thickness is too thick, it is likely that the driving voltage of the element becomes high. Therefore, the film thickness of the light emitting layer is, for example, 1 nm to 1 μm, preferably 2 nm to 500 nm and more preferably 10 nm to 200 nm.

<Electron Transport Layer and Hole Block Layer>

Those known publicly may be used as a material that constitutes the electron transport layer and the hole block layer, which may include triazole or derivatives thereof, oxazole or derivatives thereof, oxadiazole or derivatives thereof, imidazole or derivatives thereof, fluorenone or derivatives thereof, benzoquinone or derivatives thereof, naphthoquinone or derivatives thereof, anthraquinone or derivatives thereof, tetracyanoanthraquinodimethane or derivatives thereof, fluorenone or derivatives thereof, diphenyldicyanoethylene or derivatives thereof, diphenoquinone or derivatives thereof, anthraquinodimethane or derivatives thereof, anthrone or derivatives thereof, thiopyrane dioxide or derivatives thereof, carbodiimide or derivatives thereof, fluorenylidenemethane or derivatives thereof, distyrylpyradine or derivatives thereof, aromatic ring tetracarboxylic anhydride of naphthalene and perylene, phthalocyanine or derivatives thereof, various metal complexes typified by the metal complexes of 8-quinolinol or derivatives thereof (8-hydroxyquinoline or derivatives thereof) and the metal complexes using metal phthalocyanine, benzoxazole and benzothiazole as ligands, polyquinoline or derivatives thereof, polyquinoxaline or derivatives thereof, polyfluorene or derivatives thereof, and organic silane derivatives. The electron transport layer and the hole block layer may be a monolayer structure composed of one or two or more these materials, or the multilayer structure composed of multiple layers of the same composition or different compositions. The materials listed as the material that may be used in the electron injection layer may also be used in the hole injection layer.

Among them, preferable are oxadiazole or the derivatives thereof, benzoquinone or the derivatives thereof, anthraquinone or the derivatives thereof, or the metal complexes of 8-hydroxyquinoline or the derivatives thereof; polyquinoline or the derivatives thereof, polyquinoxaline or the derivatives thereof, and polyfluorene or the derivatives thereof, and preferable are 2-(4-biphenylyl)-5-(4-t-butylphenyl)-1,3,4-oxadiazole, benzoquinone, anthraquinone, tris(8-quinolinol)aluminum and polyquinoline.

The method of forming the film of the electron transport layer and the hole block layer is not particularly limited. Examples of the method of forming the film of the electron transport layer and the hole block layer may include: for low molecular electron transport materials, the vacuum deposition method from powder or the method of forming the film from the solution or a melted state; and for high molecular electron transport materials, the method of forming the film from the solution or the melted state. The polymer binder may be combined when the film is formed from the solution or the melted state. Examples of the method of forming the film of the electron transport layer and the hole block layer from the solution may include the same methods of forming the film as the aforementioned methods of forming the film of the hole transport layer from the solution.

The film thickness of the electron transport layer and the hole block layer has the varying optimal value depending on the material to be used, and may be selected so that the driving voltage and the light emitting efficiency have the appropriate value. The film thickness needs the thickness at least not to cause the pinhole. When the film thickness is too thick, it is likely that the driving voltage of the element becomes high. Therefore, the film thickness of the electron transport layer is, for example, 1 nm to 1 µm, preferably 2 nm to 500 nm and more preferably 5 nm to 200 nm.

<Electron Injection Layer>

The electron injection layer is provided between the electron transport layer and the cathode, or between the light emitting layer and the cathode. As the electron injection layer, the materials listed as the material that may be used in the electron transport layer and the hole block layer may also be used in the hole injection layer. The electron injection layer may be obtained by stacking two or more layers. The electron injection layer is formed by the deposition method, the sputtering method or the printing method. The film thickness of the electron injection layer is preferably about 1 nm to 1 µm.

<Insulating Layer>

The insulating layer having the film thickness of 2 nm or less, which the polymer light emitting element of the present invention may optionally have, has a function that makes the charge injection easy. The material of the insulating layer may be a metal fluoride, a metal oxide or an organic insulating material. The polymer light emitting element provided with the insulating layer having the film thickness of 2 nm or less may be those provided with the insulating layer having the film thickness of 2 nm or less adjacent to the cathode or those provided with the insulating layer having the film thickness of 2 nm or less adjacent to the anode.

6. Method for Forming Polymer Light Emitting Element

The method for forming the polymer light emitting element of the present invention is not particularly limited, and the polymer light emitting element of the present invention may be formed by sequentially stacking the respective layers on the substrate. Specifically, the first electrode is provided on the substrate, the layers such as the hole injection layer, the hole transport layer and the interlayer are provided as needed thereon, the light emitting layer is provided thereon, the layers such as the electron transport layer and the electron injection layer are provided as needed thereon, and further the first layer, the second layer and the third layer of the second electrode are stacked in this order thereon. Here, the stacking of the first layer to the third layer is preferably carried out by the deposition method, and more preferably carried out by the vacuum deposition method.

7. Display Device and Planar Light Source

The polymer light emitting element of the present invention may be mounted in a light emitting device. Examples of the light emitting device may include a polymer light emitting display device and a planar light source.

The polymer light emitting display device comprises the polymer light emitting element as a pixel unit. Embodiments of a pixel unit array is not particularly limited. The pixel unit array may be the array generally employed in the display device of televisions, and may be the embodiment in which many pixels are arrayed on the common substrate. The pixels arrayed on the substrate may be formed in a pixel region defined by a bank if necessary in the device of the present invention.

In the device of the present invention, it is preferable that the second electrode is electrically connected to an auxiliary electrode (electrode to be paired with a drive electrode). Meanwhile, it is preferable that the first electrode is provided as a drive electrode with a circuit for an active matrix driving scheme to make the display device with the active matrix driving scheme.

The device of the present invention may further have a sealing member on the side opposite to the substrate across the light emitting layer if necessary. Further if necessary, the device of the present invention may comprise an optional constituent such as filters such as color filters and fluorescence conversion filters, and circuits and wirings that are necessary for driving the pixels, for constituting the display device.

The device of the present invention may be made into a top emission type device in which the first electrode is the reflection electrode, the second electrode is a transmission electrode and the light is radiated from the side opposite to the substrate. Thus employing this constitution, the first electrode can be made as the drive electrode and a light radiating area can be enlarged with assuring a flexibility of a design of a drive circuit, resulting in being capable of making the display device that is excellent in display quality, driving performance and brightness half life. However, the device of the present invention is not necessarily limited thereto, and may be made into a device that has the electrodes whose surfaces are transparent or translucent and radiates the light from both sides.

The planar light source of the present invention is the light emitting device comprising the polymer light emitting element of the present invention. The planar light source may be the device in which the polymer light emitting element has been mounted on the substrate having a flat surface or the device in which the polymer light emitting element has been mounted on the substrate having a curved surface. The curved planar light source can be made, for example, by forming the polymer light emitting element on a flexible thin substrate in a flat shape and appropriately bending the substrate after the polymer light emitting element has been mounted on the substrate. The planar light source may be used as various light sources such as the light source for lighting, the light source for backlights of liquid crystal display devices and the light source of scanners.

EXAMPLES

The present invention will be described in more detail below with reference to Examples and Comparative Examples, but the present invention is not limited thereto.

Example 1

1-1: Formation of Anode and Buffer Layer

A film of a silver layer that was a first electrode having a thickness of 100 nm was formed on a glass substrate by a vacuum deposition method. This silver layer is a light reflection anode having a reflectance of 90%. Further with keeping the vacuum, a film of an $MoO_3$ layer having the thickness of 10 nm was formed as a hole injection layer on the light reflection anode.

1-2: Formation of Hole Transport Layer

A hole transport high molecular material in an amount of 0.7% by weight and xylene were mixed, obtaining a composition for forming a hole transport layer.

The substrate having the anode and the hole injection layer, which had been obtained in above (1-1), was removed from the vacuum apparatus, and the composition for forming the hole transport layer was applied on the hole injection layer by a spin coating method, obtaining a coated film having a film thickness of 20 nm.

The substrate provided with this coated film was heated at 120° C. for 20 minutes to insolubilize the coated film, and then spontaneously cooled to room temperature, obtaining a hole transport layer.

1-3: Formation of Light Emitting Layer

A light emitting high molecular material in an amount of 1.4% by weight and xylene were mixed, obtaining a composition for forming a light emitting layer.

The composition for forming the light emitting layer was applied by the spin coating method onto the hole transport layer of the substrate having the anode, the hole injection layer and the hole transport layer, which had been obtained in above (1-2), obtaining a coated film having the film thickness of 80 nm.

The substrate provided with this coated film was heated at 130° C. for 20 minutes to evaporate the solvent, and then spontaneously cooled to the room temperature, obtaining a light emitting layer.

1-4: Formation of Cathode

By the vacuum deposition method, films of a 5 nm Ba layer that was a first layer, a 5 nm Ca layer that was a second layer and a 15 nm Sn—Ag alloy (molar ratio of Sn:Ag=96:4) layer that was a third layer of a second electrode were sequentially formed on the light emitting layer of the substrate having the anode, the hole injection layer, the hole transport layer and the light emitting layer, which had been obtained in above (1-3), obtaining a cathode composed of the first layer to the third layer. The visible light transmittance of the third layer was 40% or more.

1-5: Sealing

The substrate having the laminated layers, which had been obtained in above (1-4), was removed from the vacuum deposition apparatus, and sealed with a sealing glass and a two liquid mixture epoxy resin under a nitrogen atmosphere, obtaining a light emitting element 1.

1-6: Evaluation

A voltage of 0 to 12 V was applied to the element obtained in above (1-5) to measure a maximum light emitting efficiency. A driving voltage was measured at a brightness of 1000 $cd/m^2$. A current corresponding to an initial brightness of 6000 $cd/m^2$ was applied under stable current condition to measure a brightness half life. Results are shown in Table 1.

Example 2

A light emitting element 2 was obtained and evaluated in the same manner as in Example 1, except that a film of a 15 nm Cu layer was formed as the third layer of the cathode. The results are shown in Table 1. The visible light transmittance of the third layer was 40% or more.

Example 3

A light emitting element 3 was obtained and evaluated in the same manner as in Example 1, except that films of a 1 nm Al layer as the second layer and the 15 nm Cu layer as the third layer of the cathode were formed. The results are shown in Table 1. The visible light transmittance of the third layer was 40% or more.

Example 4

A light emitting element 4 was obtained and evaluated in the same manner as in Example 3, except that a film of a 15 nm Ag layer was formed as the third layer of the cathode. The results are shown in Table 1. The visible light transmittance of the third layer was 40% or more.

Comparative Example 1

A light emitting element 5 in which the second electrode was composed of two layers was obtained and evaluated in the same manner as in Example 1, except that no Ca layer was formed, and a film of a 15 nm Sn—Ag alloy layer was formed directly on the first layer. The results are shown in Table 1.

Comparative Example 2

A light emitting element 6 in which the second electrode was composed of two layers was obtained and evaluated in the same manner as in Example 1, except that no Ca layer was formed, and the film of the 15 nm Cu layer was formed directly on the first layer. The results are shown in Table 1.

TABLE 1

|  | EXAMPLE 1 | EXAMPLE 2 | EXAMPLE 3 | EXAMPLE 4 | COMPARATIVE EXAMPLE 1 | COMPARATIVE EXAMPLE 2 |
| --- | --- | --- | --- | --- | --- | --- |
| FIRST LAYER | Ba | Ba | Ba | Ba | Ba | Ba |
| SECOND LAYER | Ca | Ca | Al | Al | Sn—Ag | Cu |
| THIRD LAYER | Sn—Ag | Cu | Cu | Ag | — | — |
| EFFICIENCY (cd/A) | 9 | 11 | 11 | 13 | 0.1 | 10.5 |
| LIFE (h) | 30 | 40 | 50 | 60 | 0.5 | 30 |

As is evident when referencing Example 1 and Comparative Example 1, when the cathode composed of the Ba first layer, the Ca second layer and the Sn—Ag alloy third layer was used, the light emitting efficiency was remarkably excellent compared with the case of using the cathode omitting such a second layer and composed of two layers of the Ba layer and the Sn—Ag alloy layer only. The brightness half life was also remarkably excellent.

As is also evident when referencing Example 2, Example 3 and Comparative Example 2, when the cathode composed of the Ba first layer, the Ca or Al second layer and the Cu third layer was used, the light emitting efficiency was excellent compared with the case of using the cathode omitting such a second layer and composed of two layers of the Ba layer and the Cu layer only. The brightness half life was also excellent.

Further as shown in Example 4, the case of using the layer composed of Ba as the first layer, Al as the second layer and Ag only as the third layer was the most excellent in both light emitting efficiency and brightness half life.

Example 5

A light emitting element 7 was obtained and evaluated in the same manner as in Example 3, except that films of a 3.5 nm LiF layer as the first layer, a 4 nm Ca layer as the second layer and the 15 nm Ag layer as the third layer were formed as the cathode. The results are shown in Table 2. The visible light transmittance of the third layer was 40% or more.

Comparative Example 3

A light emitting element 8 in which the second electrode was composed of two layers was obtained and evaluated in the same manner as in Example 1, except that the film of the 3.5 nm LiF layer as the first layer was formed, no Ca layer was formed, and the film of the 15 nm Ag layer was formed directly on the first layer. The results are shown in Table 2.

TABLE 2

|  | EXAMPLE 5 | COMPARATIVE EXAMPLE 3 |
| --- | --- | --- |
| FIRST LAYER | LiF | LiF |
| SECOND LAYER | Ca | Ag |
| THIRD LAYER | Ag | — |
| EFFICIENCY (cd/A) | 5.5 | NOT EMITTING |
| LIFE (h) | 9 | — |

As is evident when referencing Example 5 and Comparative Example 3, when the cathode composed of three layers that were LiF as the first layer, Ca as the second layer and Ag as the third layer was used, the light emitting efficiency was remarkably excellent compared with the case of using the cathode omitting such a second layer and composed of two layers of the LiF layer and the Ag layer alone. The brightness half life was also remarkably excellent.

Example 6

A light emitting element 9 was obtained and evaluated in the same manner as in Example 1, except that films of a 3.8 nm NaF layer as the first layer, a 10 nm Mg—Ag mixed layer (mixed molar ratio of Mg:Ag=2:8) as the second layer using a co-deposition method and a 5 nm Ag layer as the third layer were formed as the cathode. The results are shown in Table 3. The visible light transmittance of the third layer was 40% or more.

Example 7

A light emitting element 10 was obtained and evaluated in the same manner as in Example 1, except that films of the 3.8 nm NaF layer as the first layer, a 10 nm Mg—Ag mixed layer (mixed molar ratio of Mg:Ag=3:7) as the second layer using the co-deposition method and the 5 nm Ag layer as the third layer were formed as the cathode. The results are shown in Table 3. The visible light transmittance of the third layer was 40% or more.

Example 8

A light emitting element 11 was obtained and evaluated in the same manner as in Example 1, except that films of the 3.8 nm NaF layer as the first layer, a 10 nm Mg—Ag mixed layer (mixed molar ratio of Mg:Ag=5:5) as the second layer using the co-deposition method and the 5 nm Ag layer as the third layer were formed as the cathode. The results are shown in Table 3. The visible light transmittance of the third layer was 40% or more.

Example 9

A light emitting element 12 was obtained and evaluated in the same manner as in Example 1, except that films of the 3.8 nm NaF layer as the first layer, a 10 nm Mg—Ag mixed layer (mixed molar ratio of Mg:Ag=8:2) as the second layer using the co-deposition method and the 5 nm Ag layer as the third layer were formed as the cathode. The results are shown in Table 3. The visible light transmittance of the third layer was 40% or more.

Comparative Example 4

A light emitting element 13 in which the second electrode was composed of two layers was obtained and evaluated in the same manner as in Example 1, except that the film of the 3.8 nm NaF layer as the first layer was formed, no Mg—Ag mixed layer was formed, and the film of the 15 nm Ag layer as the third layer was formed directly on the first layer of the cathode. The results are shown in Table 3.

TABLE 3

|  | EXAMPLE 6 | EXAMPLE 7 | EXAMPLE 8 | EXAMPLE 9 | EXAMPLE 4 | COMPARATIVE EXAMPLE 4 |
|---|---|---|---|---|---|---|
| FIRST LAYER | NaF | NaF | NaF | NaF | Ba | NaF |
| SECOND LAYER | Mg:Ag = 2:8 | Mg:Ag = 3:7 | Mg:Ag = 5:5 | Mg:Ag = 8:2 | Al | Ag |
| THIRD LAYER | Ag | Ag | Ag | Ag | Ag | — |
| EFFICIENCY (cd/A) | 11 | 10 | 9 | 8.5 | 13 | NOT EMITTING |
| DRIVING VOLTAGE (V) | 4.5 | 4.3 | 4.2 | 4.2 | 6.4 | — |
| LIFE (h) | 52 | 55 | 39 | 26 | 60 | — |

As is evident when referencing Table 3, in the case of using NaF as the first layer of the cathode, when the Mg—Ag mixed layer was used as the second layer of the cathode, the light emitting efficiency was remarkably excellent. On the other hand, no electroluminescence was obtained in Comparative Example 4 in which such a second layer had been omitted.

As is evident when referencing Examples 6 to 9, in the case of using NaF as the first layer of the cathode, Examples 6 and 7 in which the molar ratio of Mg was 20% to 30% in the Mg—Ag mixed layer used as the second layer of the cathode were excellent in the light emitting efficiency and the brightness half life compared with Examples 8 and 9 in which such a molar ratio of Mg was 50% or more.

As is evident when referencing Table 3, Examples 6 to 9 in which NaF was used as the first layer of the cathode was more excellent in consumed electric power because the driving voltage was lower than Example 4 in which Ba was used as the first layer of such a cathode.

Example 10

2-1: Formation of Anode and Buffer Layer

A film of a silver layer that was a first electrode having the thickness of 100 nm was formed on a glass substrate by the vacuum deposition method. This silver layer is the light reflection anode having the reflectance of 90%. Further with keeping the vacuum, a film of an MoO₃ layer having the thickness of 10 nm was formed as a hole injection layer on the light reflection anode.

2-2: Formation of Hole Transport Layer

A hole transport high molecular material in an amount of 0.7% by weight and xylene were mixed to obtain a composition for forming a hole transport layer. The hole transport high molecular material represented by the following formula (2) here was the following compound exemplified as P1 in International Publication WO2005/52027 Pamphlet. This hole transport high molecular material was prepared using the method of Scheme 1 in International Publication WO2005/52027 Pamphlet

[Chem. 2]

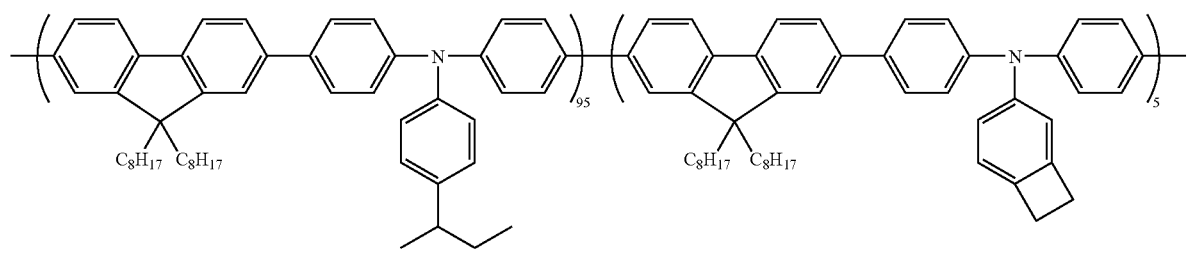

(2)

The substrate having the anode and the hole injection layer, which had been obtained in above (2-1), was removed from the vacuum deposition apparatus, and the composition for forming the hole transport layer was applied on the hole injection layer by the spin coating method to obtain a coated film having the film thickness of 20 nm.

The substrate provided with this coated film was heated at 190° C. for 20 minutes to insolubilize the coated film, and then spontaneously cooled to room temperature to obtain the hole transport layer.

2-3: Formation of Light Emitting Layer

A light emitting high molecular material in an amount of 1.3% by weight and xylene were mixed to obtain a composition for forming a light emitting layer. Here, Lumation GP1300 supplied from Sumation Co., Ltd was used for the light emitting high molecular material.

The composition for forming the light emitting layer was applied by the spin coating method onto the hole transport layer of the substrate having the anode, the hole injection layer and the hole transport layer, obtained in the above (2-2), obtaining a coated film having the film thickness of 80 nm. The substrate provided with this coated film was heated at 130° C. for 20 minutes to evaporate the solvent, and then spontaneously cooled to the room temperature, obtaining the light emitting layer.

2-4: Formation of Cathode

By the vacuum deposition method, films of a 5 nm Ba layer that was the first layer, a 1.5 nm Al layer that was the second layer and a 15 nm Ag layer that was the third layer of the second electrode were sequentially formed on the light emitting layer of the substrate having the anode, the hole injection layer, the hole transport layer and the light emitting layer, which had been obtained in above (2-3), obtaining a cathode composed of the first layer to the third layer. The visible light transmittance of the third layer was 40% or more.

2-5: Sealing

The substrate having the laminated layers, which had been obtained in above (2-4), was removed from the vacuum deposition apparatus, and sealed with the sealing glass and the two liquid mixture epoxy resin under the nitrogen atmosphere, obtaining a light emitting element 14.

2-6: Evaluation

The element obtained in above (2-5) was evaluated in the same manner as in Example 1. The results are shown in Table 4.

Example 11

A light emitting element 15 was obtained and evaluated in the same manner as in Example 10, except that films of a 3 nm NaF layer as the first layer, a 10 nm Mg—Ag mixed layer (mixed molar ratio of Mg:Ag=3:7) as the second layer using the co-deposition method and the 5 nm Ag layer as the third layer were formed as the cathode. The results are shown in Table 4. The visible light transmittance of the third layer was 40% or more.

Comparative Example 5

A light emitting element 16 in which the second electrode was composed of two layers was obtained and evaluated in the same manner as in Example 10, except that the film of the 5 nm Ba layer as the first layer was formed, no Al layer was formed, and the film of the 15 nm Ag layer was formed directly on the first layer of the cathode. The results are shown in Table 4.

Comparative Example 6

A light emitting element 17 in which the second electrode was composed of two layers was obtained and evaluated in the same manner as in Example 10, except that the film of the 3.8 nm NaF layer as the first layer was formed, no Mg—Ag mixed layer was formed, and the film of the 15 nm Ag layer was formed directly on the first layer of the cathode. The results are shown in Table 4.

TABLE 4

|  | EXAMPLE 10 | EXAMPLE 11 | COMPARATIVE EXAMPLE 5 | COMPARATIVE EXAMPLE 6 |
| --- | --- | --- | --- | --- |
| FIRST LAYER | Ba | NaF | Ba | NaF |
| SECOND LAYER | Al | Mg:Ag = 3:7 | Ag | Ag |
| THIRD LAYER | Ag | Ag | — | — |
| EFFICIENCY (cd/A) | 13 | 12 | 10 | NOT EMITTING |
| LIFE (h) | 72 | 75 | 43 | — |

As is evident when referencing Example 10 and Comparative Example 5, the case of using Ba as the first layer of the cathode when the Al layer was used as the second layer of the cathode was more excellent in light emitting efficiency and brightness half life than Comparative Example 5 in which such a second layer was omitted.

As is evident when referencing Example 11 and Comparative Example 6, the case of using NaF as the first layer of the cathode when the Mg—Ag mixed layer was used as the second layer of the cathode was remarkably excellent in light emitting efficiency compared with Comparative Example 6 in which such a second layer was omitted and which resulted in obtaining no electroluminescence.

The invention claimed is:

1. A polymer light emitting element comprising: a first electrode, a second electrode, and a light emitting layer provided between the first electrode and the second electrode and containing a polymer compound,
    wherein the second electrode is composed of three layers, a first layer, a second layer and a third layer arranged in this order viewed from the light emitting layer,
    wherein the first layer contains sodium fluoride,
    wherein at least one material contained in the second layer is magnesium, which has a reducing action on at least one material contained in the first layer, and
    wherein the visible light transmittance of the third layer is 40% or more.

2. The polymer light emitting element according to claim 1, wherein each of all material(s) contained in the second layer has a reducing action on all material(s) contained in the first layer.

3. The polymer light emitting element according to claim 1, wherein the third layer is composed of a material selected from the group consisting of gold, silver, copper, tin, lead, nickel, indium and an alloy thereof and a film thickness thereof is 5 nm to 30 nm.

4. The polymer light emitting element according to claim 1, wherein the visible light reflectance of the first electrode is 80% or more.

5. A method for manufacturing the polymer light emitting element according to claim 1, comprising:
a step of providing the first electrode on a substrate,
a step of providing the light emitting layer on the first electrode and
a step of providing the second electrode on the light emitting layer,
wherein the step of providing the second electrode includes:
a step of providing the first layer that contains sodium fluoride on the light emitting layer,
a step of providing the second layer that contains magnesium on the first layer and
a step of providing the third layer on the second layer.

6. The method according to claim 5, wherein the step of providing the first layer on the light emitting layer, the step of providing the second layer on the first layer and the step of providing the third layer on the second layer are carried out by a vacuum deposition method.

7. A polymer light emitting display device comprising the polymer light emitting element according to claim 1 as a pixel unit.

8. A planar light source having the polymer light emitting element according to claim 1.

9. A polymer light emitting element comprising: a first electrode, a second electrode, and a light emitting layer provided between the first electrode and the second electrode and containing a polymer compound,
wherein the second electrode is composed of three layers, a first layer, a second layer and a third layer arranged in this order viewed from the light emitting layer,
wherein the first layer contains sodium fluoride,
wherein the second layer contains magnesium, and
wherein the visible light transmittance of the third layer is 40% or more.

10. The polymer light emitting element according to claim 9, wherein the third layer is composed of a material selected from the group consisting of gold, silver, copper, tin, led, nickel, indium and an alloy thereof and a film thickness thereof is 5 nm to 30 nm.

11. The polymer light emitting element according to claim 9, wherein the visible light reflectance of the first electrode is 80% or more.

12. A method for manufacturing the polymer light emitting element according to claim 9, comprising:
a step of providing the first electrode on a substrate,
a step of providing the light emitting layer on the first electrode and
a step of providing the second electrode on the light emitting layer,
wherein the step of providing the second electrode includes:
a step of providing the first layer that contains sodium fluoride on the light emitting layer,
a step of providing the second layer that contains magnesium on the first layer and
a step of providing the third layer on the second layer.

13. The method according to claim 12, wherein the step of providing the first layer on the light emitting layer, the step of providing the second layer on the first layer and the step of providing the third layer on the second layer are carried out by a vacuum deposition method.

14. A polymer light emitting display device comprising the polymer light emitting element according to claim 9 as a pixel unit.

15. A planar light source having the polymer light emitting element according to claim 9.

* * * * *